United States Patent [19]

Itow et al.

[11] Patent Number: 6,058,029

[45] Date of Patent: May 2, 2000

[54] POWER UNIT FOR GENERATING DISCHARGE SHOCK WAVES

[75] Inventors: Koichiro Itow, Shibuya-ku; Ryuichi Shimada, Yokohama; Hikosaburo Hiraki, Oyama, all of Japan

[73] Assignee: Komatsu LTD., Tokyo, Japan

[21] Appl. No.: 09/242,570

[22] PCT Filed: Aug. 19, 1997

[86] PCT No.: PCT/JP97/02865

§ 371 Date: Feb. 18, 1999

§ 102(e) Date: Feb. 18, 1999

[87] PCT Pub. No.: WO98/08296

PCT Pub. Date: Feb. 26, 1998

[30] Foreign Application Priority Data

Aug. 21, 1996 [JP] Japan ................................. 8/237348

[51] Int. Cl.[7] .............................. H02M 3/18; H01J 17/00
[52] U.S. Cl. .................. 363/59; 363/60; 307/108; 307/110
[58] Field of Search ..................... 363/60, 59; 307/108, 307/110, 415, 297

[56] References Cited

U.S. PATENT DOCUMENTS

| | | | |
|---|---|---|---|
| 3,832,569 | 8/1974 | Anderson et al. | 307/110 |
| 3,842,322 | 10/1974 | Aslin | 307/110 |
| 4,275,317 | 6/1981 | Laudenslager et al. | 307/415 |
| 4,375,594 | 3/1983 | Ewanizky, Jr. | 307/110 |
| 4,900,947 | 2/1990 | Weiner et al. | 363/59 |
| 5,105,097 | 4/1992 | Rothe | 307/108 |
| 5,216,695 | 6/1993 | Ross et al. | 375/59 |
| 5,798,579 | 8/1998 | McPhee | 307/106 |

FOREIGN PATENT DOCUMENTS

| | | |
|---|---|---|
| 60-106376 | 6/1985 | Japan . |
| 61-269682 | 11/1986 | Japan . |
| 2120579 | 12/1983 | United Kingdom . |

Primary Examiner—Peter S. Wong
Assistant Examiner—Rajnikant B. Patel
Attorney, Agent, or Firm—Sidley & Austin

[57] ABSTRACT

A power unit for creating discharge shock waves, which is excellent in performance, reliability, and durability is provided with: a plurality of capacitors (C1–C6), connected in series; first coils (L1, L2, L3) and switches (S1, S2, S3), which are connected to every other one of the capacitors (C1, C3, C5); first resistors (R11, R12, R13), which are connected in series with the first terminal of a power source (1); second resistors (R21, R22, R23), which are connected in series with the second terminal of the power source (1); and a discharge electrode (2), which is provided on the output side of the last capacitor (C6); wherein each switch (S1, S2, S3) has a first main electrode (a), a second main electrode (b), and a triggering electrode (c). The triggering electrode (c) of a first-stage switch (S1) is connected to a triggering voltage source (3), and the first main electrodes (a) and second main electrodes (b) of the switches (S1, S2), other than the final-stage switch (S3), are respectively connected to second capacitors (C71, C72) and the primary sides (d1, d1) of insulating pulse transformers (T1, T2) via serial electric paths. The triggering electrodes (c) and second main electrodes (b) of the switches (S2, S2) other than the first-stage switch (S1) are connected via the secondary sides (d2, d1) of the insulating pulse transformers (T1, T2).

28 Claims, 5 Drawing Sheets

F I G. 6
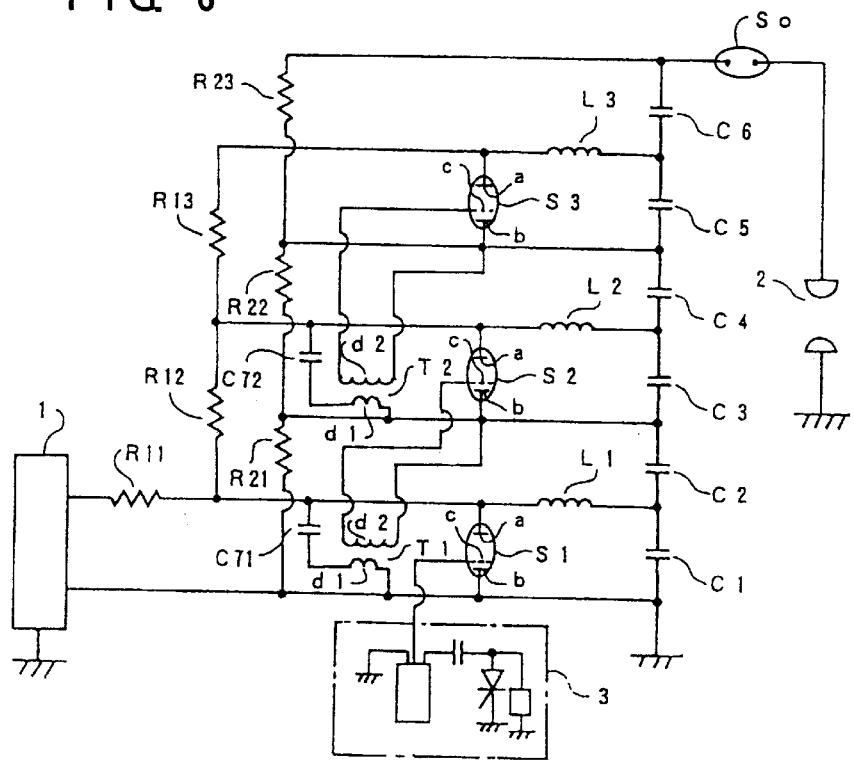
F I G. 7
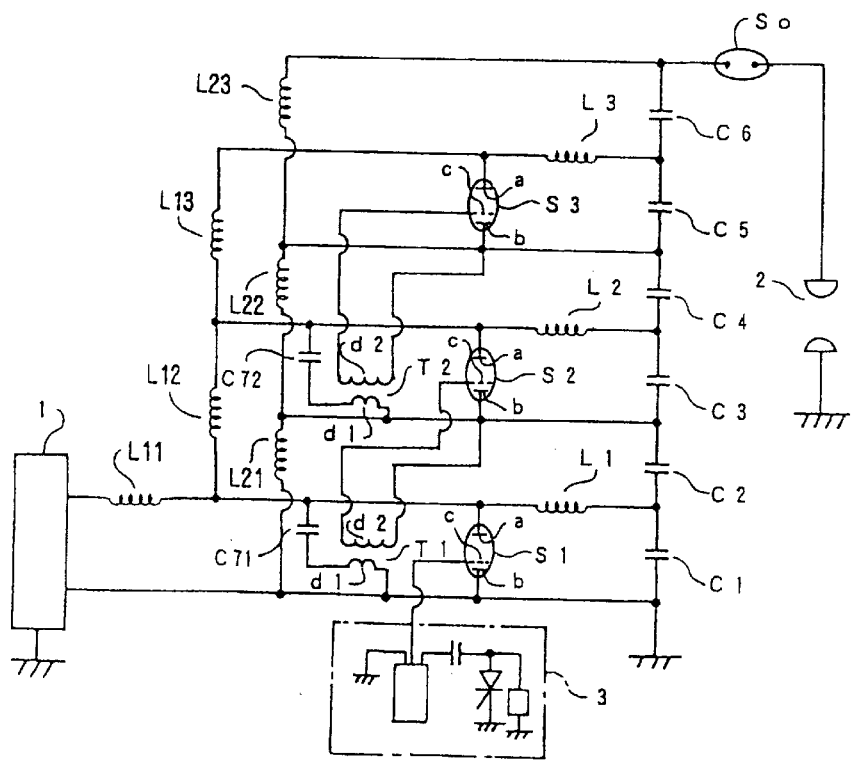

1

POWER UNIT FOR GENERATING DISCHARGE SHOCK WAVES

TECHNICAL FIELD

The present invention relates to a power unit for creating discharge shock waves which are used for crushing rocks, stones, or concrete.

BACKGROUND ART

Recently, as is seen in British Laid-open Patent No. 2120579, a method has become known in which portions of stones, rocks, or concrete to be crushed are surrounded by a liquid environment, and a high-voltage discharge is generated to create shock waves, thereby crushing the stones, rocks, or concrete.

FIG. 10 shows a so-called Marx generator, which is a power unit for creating discharge shock waves by generating a high-voltage discharge in the aforesaid method. The Marx generator generates a pulse at a discharge electrode 2 with the pulse having a high voltage (50 kV to 800 kV) and a pulse width of about 200 nsec, from an inexpensive power source 1 of smaller voltage (40 kV). For example, as shown in the drawing, six capacitors C1 to C6 are sequentially connected in parallel to the power source 1 via resistors 3a to 3k. In addition, the upstream and downstream sides of each pair of adjacent opposed capacitors C1 and C2, C2 and C3, C3 and C4, C4 and C5, and C5 and C6, are respectively connected by switches S11 to S15, and the last capacitor C6 is connected to the discharge electrode 2.

Specifically, in the Marx generator in FIG. 10, the capacitors C1 to C6 are respectively charged with the current from the power source 1 (40 kV) by opening the switches S11 to S15. Thereafter, the capacitors C1 to C6 are switched from the parallel connection to a serial connection by simultaneously closing the switches S11 to S15, thereby establishing a high-voltage power source of 240 kV as a whole, and a discharge pulse is generated at the discharge electrode 2 with a pulse width of about 200 nsec, for example.

However, in the aforesaid Marx generator, the discharging current flows through the switches S11 to S15, thereby wearing the switches S11 to S15; therefore, disadvantages occur in the performance, reliability, durability, and cost. In addition, there is a disadvantage in that the inductance components of the switches S11 to S15 prevent the generation of "a shorter pulse" which is advantageous in generating shock waves.

SUMMARY OF THE INVENTION

The present invention is made to eliminate the aforesaid disadvantages of the prior art, and its object is to provide a power unit for creating discharge shock waves which is more advantageous in performance, reliability, durability, and cost.

Each of a first configuration and a second configuration of a power unit for creating discharge shock waves according to the present invention includes:

a plurality of capacitors connected in series;

first coils and switches, which are connected to every other one of the capacitors so that the every other capacitors out of the plurality of capacitors can be switched into a LC series circuit;

first resistors or second coils, which are connected in series between a first power source terminal of a power source and the connections between the respective first coils and the respective switches;

second resistors or third coils, which are provided between the second power source terminal side of a respective second capacitor, which is other than said every other capacitors out of the plurality of capacitors, and the second power source terminal side of a respective switch, and which are connected in series with the second power source terminal of the power source; and a discharge electrode, which is provided on the output side of the last capacitor out of the plurality of capacitors.

According to the aforesaid circuit, the following effects are obtained. All of the capacitors are charged from the power source with all the switches being open. However, the polarities of the capacitors on some sides become different from the polarities of the capitors on other sides. If all the switches are closed at the same time after the charging for all of the capacitors is completed, the capacitors on some sides discharge and the polarities are reversed. Accordingly, the polarities of all of the capacitors become the same, and the high voltage of the capacitors connected in series to the discharge switch is applied, thereby enabling a high-voltage discharge. When all of the switches are closed, the respective discharging currents of the capacitors on some sides flow through all of the switches, but the currents are controlled by the respective coils. Therefore, the disadvantage that "the discharging currents flow through the switches", "thereby wearing the switches", "therefore disadvantages occur in the performance, reliability, durability, and cost" as in the prior art is eliminated. Incidentally, the first and the second resistors are discharge compensating resistors for smoothly carrying out the discharge of the respective capacitors on the aforesaid some sides.

In addition to the aforesaid circuit, the first configuration is a power unit for creating discharge shock waves characterized by:

each of the switches being composed of a switch, such as a triple-pole spark gap, a thyratron, an ignitron, or a thyristor, having a first main electrode connected with each of the first coils, a second main electrode connected to each of the every other capacitors, and a triggering electrode;

the triggering electrode of the first-stage switch, out of the switches, being connected to a triggering voltage source;

the first main electrodes and the second main electrodes of the switches, other than the final-stage switch out of the switches, being respectively connected to second capacitors and the primary sides of insulating pulse transformers via serial electric paths; and the triggering electrodes and the second main electrodes, of the switches other than the first-stage switch out of the switches, being respectively connected via the secondary sides of the insulating pulse transformers.

According to the first configuration, the following effects are obtained. All the capacitors, including the second capacitors, are charged with all the switches being open. When a triggering voltage is applied to the triggering electrode of the first-stage switch from the triggering voltage source, main discharge occurs between the main electrodes of the first-stage switch, thereby closing the first-stage switch. The second capacitors then discharge by way of the first-stage switch, and the discharging current passes through the primary side of the insulating pulse transformer and excites the secondary side. The excitation voltage is applied to the triggering electrode of the next-stage switch, thereby causing a main discharge between the main electrodes of the next-stage switch and closing the next-stage switch. The operation is repeated for the final-stage switch.

Specifically, the triggering power source of each switch is independent, and the triggering voltage appears between the triggering electrode and the second main electrode of the respective switch, which is therefore unaffected by any change in the potential of the second main electrode of the switch. Specifically, application timings of the triggering voltage do not differ greatly according to the switches. The configuration is made by only the single triggering voltage source, the second capacitors, the insulating pulse transformers, and the connecting wires thereof. In addition, the triggering voltage source is a product comparative to a so-called CDI unit, which ignites a spark plug of a gasoline engine, and is economical.

Meanwhile, in addition to the aforesaid circuit, the second configuration is a power unit for generating discharge shock waves characterized by:

each of the switches being composed of a switch, such as a triple-pole spark gap, a thyratron, an ignitron, or a thyristor, having a first main electrode connected with each of the first coils, a second main electrode connected to each of the every other capacitors, and a triggering electrode;

the triggering electrode of the first-stage switch, out of the switches, being connected to a triggering voltage source;

each the switches, other than the final-stage switch out of the switches, having its second main electrode connected to the triggering electrode of the next-stage switch and its first main electrode connected to the second main electrode of the next-stage switch via each of third capacitors; and the triggering electrode and the second main electrode of the switches, other than the first-stage switch out of the switches, being respectively connected through third resistors.

According to the second configuration, the following effects are obtained. All the capacitors, including the third capacitors, are charged with all the switches being open. When a triggering voltage is applied to the triggering electrode of the first-stage switch from the triggering voltage source, a main discharge occurs between the main electrodes of the first-stage switch, thereby closing the first-stage switch. The third capacitors then discharge by way of the first-stage switch and the third resistors when a voltage compensated in the third resistors occurs at the triggering electrode of the next-stage switch. The voltage is then applied to the triggering electrode of the next-stage switch, thereby causing a main discharge between the main electrodes of the next-stage switch and closing the next-stage switch. The operation is repeated for the final-stage switch.

Specifically, the triggering power source of each switch is independent, and the triggering voltage appears between the triggering electrode and the second main electrode of each switch, which is therefore unaffected by any change in the potential of the second main electrode of each switch. Specifically, the application timings of the triggering voltage do not differ according to the switches. Accordingly, the maximum charging voltage after reversing can be made larger. The configuration is made by only the single triggering voltage source, the third capacitors, the third resistors, and the connecting wires thereof. Accordingly, it is economical. Specifically, the same effects as in the aforesaid first configuration can be obtained.

BRIEF DESCRIPTION OF THE DRAWINGS

FIG. 6 is a circuit diagram according to the first embodiment of the present invention;

FIG. 7 is a circuit diagram in which first and second resistors in FIG. 6 are replaced by coils;

BEST MODE FOR CARRYING OUT THE INVENTION

Preferred embodiments of the present invention will now be described in detail below with reference to the attached drawings.

Figure 1:
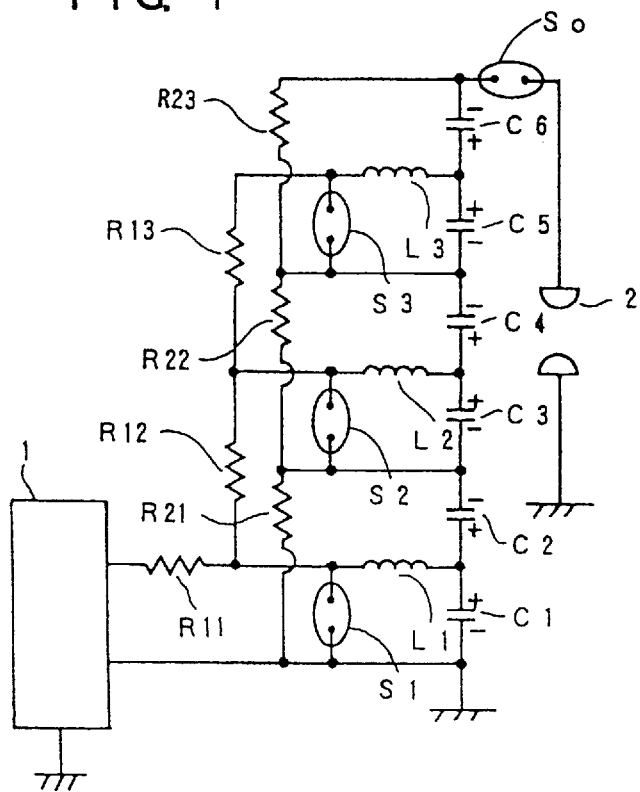
FIG. 1 is a basic circuit diagram according to a first embodiment and a second embodiment of the present invention.
Figure 2:
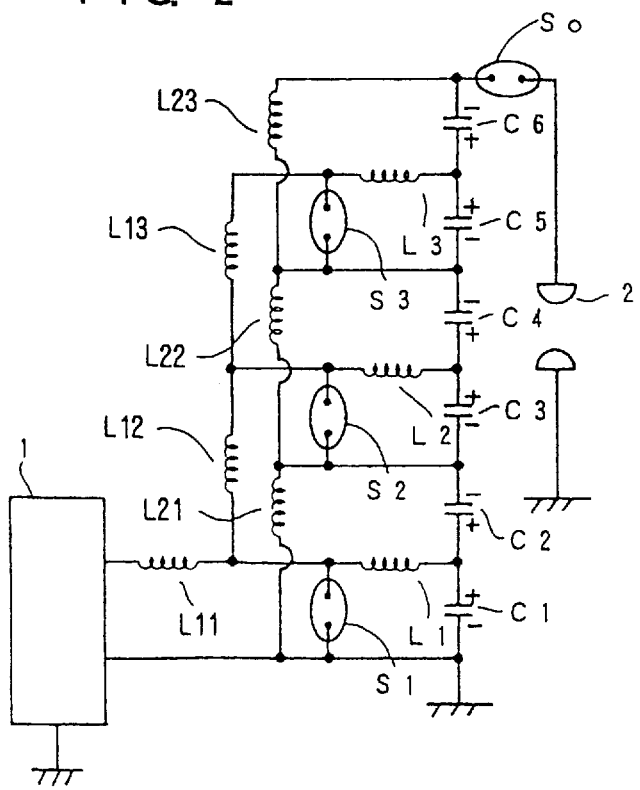
FIG. 2 is a circuit diagram in which first and second resistors in FIG. 1 are replaced by coils.

FIG. 1 shows a basic circuit according to the present invention, and six capacitors C1 to C6 are connected in series. Out of these capacitors, the first capacitor C1 is grounded, and the last capacitor C6 is connected to the discharge electrode 2 via a main switc So. Common terminals of the adjacent capacitors C1 and C2, C3 and C4, and C5 and C6 are respectively connected to a power source 1 by first coils L1 to L3 and first resistors R11 to R13 corresponding thereto. Meanwhile, common terminals of the adjacent capacitors C2 and C3, and C4 and C5, capacitor C6, and the switch So are respectively grounded via second resistors R21 to R23, corresponding thereto. The power source side of the first coil L1 is grounded via a switch S1, and the power source side of the first coil L2 is connected to the upstream side of the second resistor R21 via a switch S2. The power source side of the first coil L3 is connected to at the upstream side of the second resistor R22 via a switch S3. The first resistors R11 to R13 are connected in series, and the second resistors R21 to R23 are also connected in series. The first resistors R11 to R13 and the second resistors R21 to R23 can be respectively replaced by second coils L11 to L13 and third coils L21 to L23, as shown in FIG. 2. By replacing them with the coils L11 to L13 and L21 to L23, the charging time can be shortened.

Figure 3:
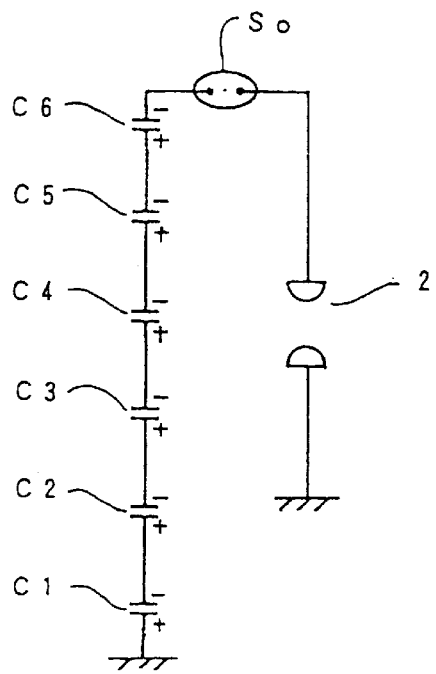
FIG. 3 is an explanatory diagram of inversion of capacitors in FIG. 1.
Figure 4:
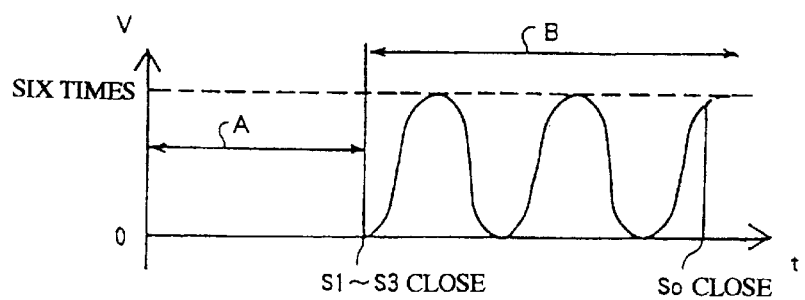
FIG. 4 is a diagram showing a variation with time of the maximum accumulated voltage before and after the main switch is opened and closed.

The operation of the aforesaid basic circuit will be explained with reference to FIGS. 3 and 4. FIG. 1 shows a situation in which, when all of the switches S1 to S3 are open, the current from the power source 1 (for example, 40 kV) charges the capacitors C1 and C2 via the first resistor R11 and the first coil L1. At the same time, the current from the power source 1 charges the capacitors C3 and C4 via the first resistors R11 and R12, the second resistors R21 and R22, and the first coil L2. The current from the power source 1 further charges the capacitors C5 and C6 via the first resistors R11 to R13, the second resistors R21 to R23, and the first coil L3. Here, the charging times differ depending upon the differences in the resistance, but the charging can be completed. As a result of the charging, the capacitors C1, C3, and C5 are the same in polarity, and the capacitors C2, C4, and C6 are the same in polarity, but the former group and the latter group are opposite in polarity to one another. Specifically, in the situation shown in FIG. 1, the voltages of all of the capacitors C1 to C6, seen from the discharge electrode 2, are zero (=0V) as shown in the area A in FIG. 4, representing a situation wherein the switches S1 to S3 are open.

Next, in the situation in FIG. 1, when the charging of all of the capacitors C1 to C6 is completed, the switches S1 to S3 are closed simultaneously. In doing so, three LC direct-coupled circuits C1-L1-S1-C1, C3-L2-S2-C3, and C5-L3-S3-C5 are formed by the capacitors C1, C3, and C5, the first coils L1 to L3, and the switches S1 to S3. Thus, the polarities of the capacitors C1, C3, and C5 are reversed by the first coils L1 to L3 and the switches S1 to S3. Specifically, the polarities of all of the capacitors C1 to C6 become the same, as shown in FIG. 3. Specifically, as shown by the area B in FIG. 4, which represents a situation wherein the switches S1 to S3 are closed, the voltages of all of the capacitors C1 to C6, seen from the discharge electrode 2, become 240 kV. Accordingly, by closing the switch So at the high voltage as described above, the discharge electrode 2 can discharge at a high voltage.

Specifically, the current, which is limited by the first coils L1 to L3, is only passed to the switches S1 to S3, thereby eliminating the disadvantage of being unfavorable "in the performance, reliability, durability, and cost", since "the discharge current flows through the switches S11 to S15, thereby wearing the switches S11 to S15" as in the aforesaid prior art. At the same time, the disadvantage that "the inductance components of the switches S11 to S15 in the conventional Marx generator hinders the generation of "a shorter pulse" which is advantageous in generating shock waves" can be eliminated.

Incidentally, when the switches S1 to S3 are closed, the three LC direct-coupled circuits C1-L1-S1-C1, C3-L2-S2-C3, and C5-L3-S3-C5 are produced as described above. However, since they are LC oscillation circuits, if they are uncontrolled, the voltage, which can be induced at the discharge electrode 2, cyclically increases and decreases between zero (=0V) and 240 kV which is larger by six times with the passage of time t, as shown in the area B in FIG. 4. Accordingly, the discharge electrode 2 can discharge by closing the main switch So just before the maximum voltage (240 kV) is established. However, the following disadvantage occurs here.

First, the switches S1 to S3 will be explained. When the capacitors C1, C3, and C5 are charged (specifically, when the switches S1 to S3 are open), the respective charging voltages are high. Here, according to the circuit in FIG. 1, the switches S1 to S3 are hardly worn as compared to those in the prior art as described above. However, if the switches S1 to S3 to which higher voltages are applied are configured mechanically, wear occurs naturally. In a first embodiment, triple-pole spark gaps, thyratrons, ignatrons, thyristors, or the like, which have pressure resistance at a lower cost, are used as the switches S1 to S3. As for a gap switch, for example, an air gap switch, a gas filled gap switch, and a vacuum gap switch are cited. The switch has a main electrode and a triggering electrode, to which a triggering voltage is applied for generating a main discharge at the main electrode and for continuing the main discharge. In the first embodiment, one of the main electrodes of each of the switches S1 to S3 (hereinafter, called a first main electrode) is connected to each of the first coils L1 to L3, the other one of the main electrodes (hereinafter, called a second main electrode) is connected to each of the capacitors, and a triggering electrode is connected to a triggering power source.

Figure 5:
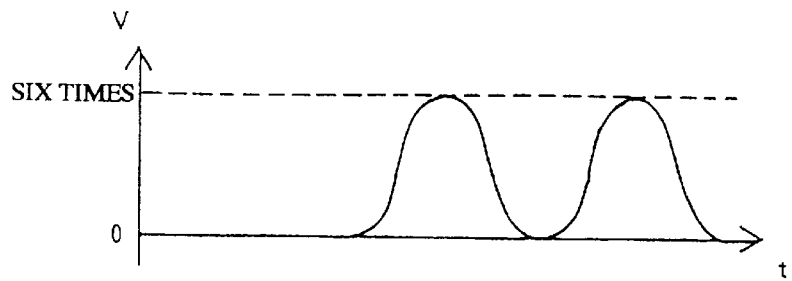
FIG. 5 is a diagram showing a variation with time of the reduction of the maximum accumulated voltage based on sequential delays in the closing of a plurality of switches in FIG. 1.

Spedcally, the aforesaid disadvantages are as follows. When a triggering voltage is applied to the switches S1 to S3, the switches S1 to S3 are closed, then the capacitors C1, C3, and C5 are reversed as time t passes, and the polarities of all of the capacitors C1 to C6 become the same, thereby increasing the voltage. The potential differences between the second main electrodes of the switches S1 to S3 and the ground increase greatly with every one of the switches S1 to S3 (or with every one of the capacitors C1, C3, and C5) as the time t passes. Specifically, the potential of the triggering electrode for the switches S1 to S3 has to be a triggering voltage which has a higher potential than that of the second main electrode even when the capacitors finish reversing. In order to realize this, a first solution is to previously prepare the same number of triggering voltage sources, which can supply a trigger voltage higher than the potential of the second main electrode of each of the switches S1 to S3, as the number of the switches S1 to S3. However, in doing so, it is necessary to prepare the same number of triggering voltage sources of different capacities as that of the switches S1 to S3, thereby causing a disadvantage of being inapplicable to a very-high-voltage power unit for creating discharge shock waves. Thus, as a second solution, electrical elements, such as various kinds of resistors, are involved in a triggering voltage source, thereby adjusting the triggering voltage for each of the switches S1 to S3. However, this solution causes a disadvantage in that the application timings of the triggering voltage easily differ according to the electrical elements. Specifically, the timings of starting to reverse the respective switches S1 to S3 differ, thereby causing a disadvantage of obtaining only a discharge voltage of not more than the maximum voltage 240 kV (for example, about 200 kV) as is shown in FIG. 5. However, the second solution has an advantage of enabling the production at a lower cost.

In th first embodiment, the aforesaid second solution, which is applicable to an ultra-high-voltage power unit for creating shock waves and is inexpensive, is incorporated into the basic circuit of FIG. 1. The aforesaid second solution in the first embodiment has a configuration which eliminates the disadvantage thereof, that is, "the disadvantage that the application timings of the triggering voltage easily differ according to electric elements". The details are as shown in FIG. 6.

FIG. 6 describes the example of the aforesaid second solution in the same circuit as in FIG. 1. A triggering electrode c of the first-stage switch S1 is connected to the triggering voltage source 3. The switches S1 and S3 are connected as follows. For the switch S1, the first main electrode a and the second main electrode b are connected via a serial path of a second capacitor C71 and a primary side d1 of an insulating pulse transformer T1. Similarly for the switch S3, the first main electrode a and the second main electrode b are connected via a serial electric path of a second capacitor C72 and the primary side d1 of an insulating pulse transformer T2. The switches S2 and S3 are also connected as follows. For the switch S2, the triggering electrode c and the second main electrode b are connected via a secondary side d2 of the insulating pulse transformer T1. Similarly for the switch S3, the triggering electrode c and the second main electrode b are connected via the secondary side d2 of the insulating pulse transformer T2.

The operation of the aforesaid circuit will be explained. First, the capacitors C1 to C6, as well as the second capacitors C71 and C72, are charged with the switches S1 to S3 being open. When a triggering voltage is applied to the triggering electrode c of the switch S1 from the triggering voltage source 3, a main discharge occurs between the main electrodes a and b, and the switch S1 stands open. The second capacitor C71 then discharges by way of the switch S1, and the discharging current passes through the primary side d1 of the insulating pulse transformer T1 and excites the secondary side d2. The excitation voltage is applied to the triggering electrode c of the switch S2, causing a main discharge between the main electrodes a and b to thereby bring the switch S2 into a state in which it is closed. The second capacitor C72 then discharges by way of the switch S2, and the discharging current passes through the primary side d1 of the insulating pulse transformer T2 and energizes the secondary side d2. The energizing voltage is applied to the triggering electrode c of the switch S3, causing a main discharge between the main electrodes a and b to thereby bring the switch S3 into a state in which it is closed. Specifically, the switches S1 to S3 are in a state in which they are closed.

According to the aforesaid circuit, the triggering power source of each of the switches S1 to S3 is independent, and the triggering voltages are voltages appearing between the triggering electrodes c and the second main electrodes b of the switches S1 to S3. Consequently, no matter how electric potentials of the second main electrodes b of the switches S1 to S3 may change, the triggering voltage is not affected by the change. Specifically, for the second capacitors C71 and C72 of 40 kV and 2000 pF (for example, ceramic capacitors), delays in starting the operation of the switches S1 to S3 are 10 nsec, respectively. Specifically, the disadvantage in the aforesaid second solution, that is "the disadvantage that the application timings of voltage easily differ according to electric elements", is eliminated. Accordingly, the maximum discharging voltage after reversing can be made to be 240 kV. In addition, the configuration is made by only the single triggering voltage source 3, the second capacitors C71 and C72 respectively provided at the switches S1 and S2, the insulating pulse transformers T1 and T2, and the connection wires thereof. Further, the triggering voltage source 3 is a product comparable to a so-called CDI unit, which ignites a spark plug of a gasoline engine, and is inexpensive.

As shown in FIG. 7, the first resistors R11 to R13 and the second resistors R21 to R23 can be replaced by the second coils L11 to L13 and the third coils L21 to L23. Similar operational effects are obtained, and the charging time can be shortened.

Figure 8:
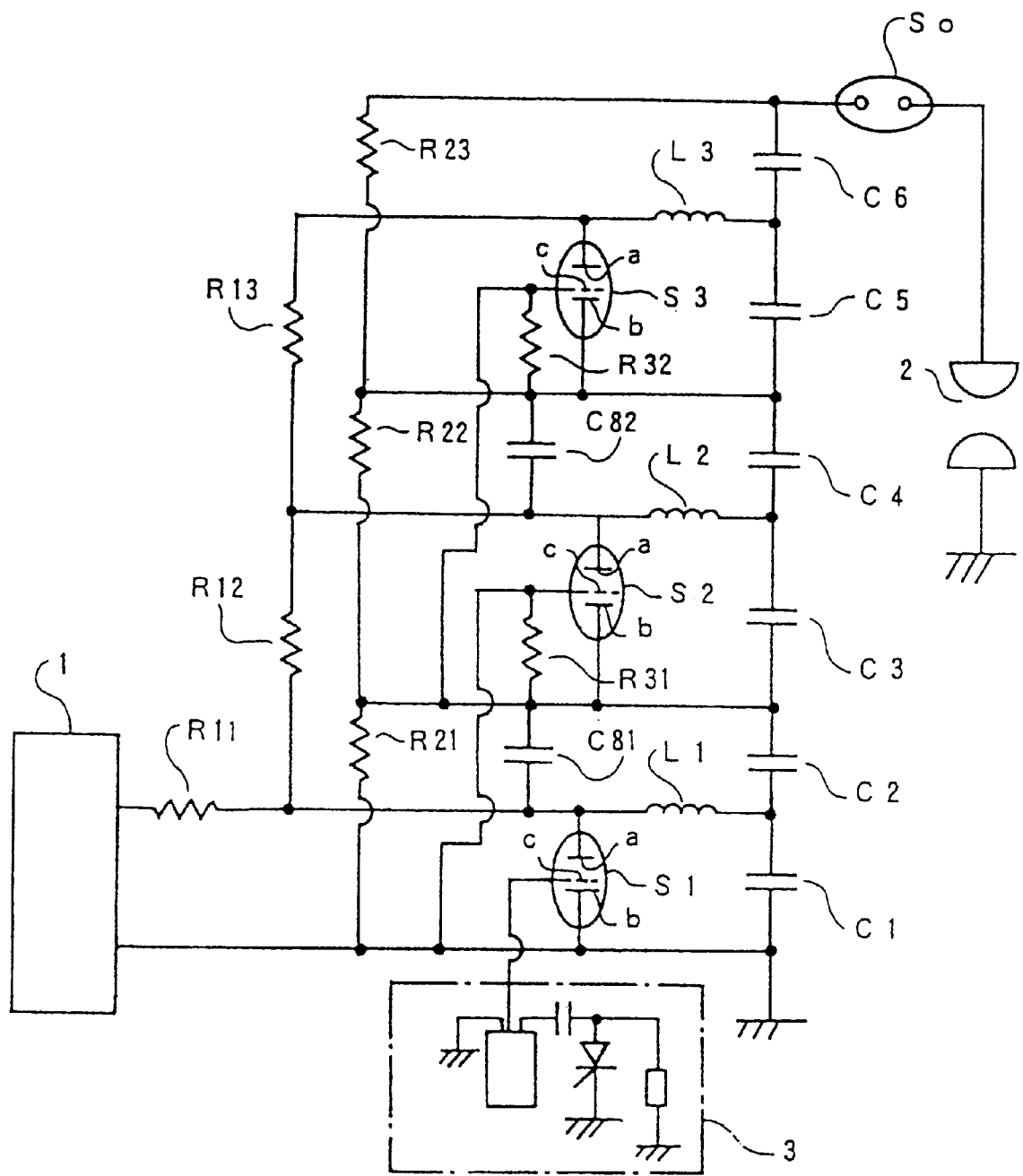
FIG. 8 is a circuit diagram according to the second embodiment of the present invention.

A second embodiment will be explained with reference to FIG. 8. FIG. 8 describes another example of the aforesaid second solution in the same circuit as in FIG. 1. The triggering electrode c of the first-stage switch S1 is connected to the triggering voltage source 3. The switches S1 and S2 other than the final-stage switch 3 are connected as follows. For the switch S1, the second main electrode b is connected to the triggering electrode c of the switch S2, and the first main electrode a is connected to the second main electrode b of the switch S2 via a third capacitor C81. For the switch S2, the second main electrode b is connected to the triggering electrode c of the switch S3, and the first main electrode a is connected to the second main electrode b of the switch S3 via a third capacitor C82. The switches S2 and S3 other than the first-stage switch S1 are connected as follows. For the switch S2, the triggering electrode c and the second main electrode b are connected via a third resistor R31. For the switch S3, the triggering electrode c and the second main electrode b are connected via a third resistor R32.

The operation of the aforesaid circuit will be explained. First, with the switches S1 to S3 being open, the capacitors C1 to C6 as well as the third capacitors C81 and C82 are charged. When the triggering voltage is applied to the triggering electrode c of the switch S1 from the triggering voltage source 3, a main discharge occurs between the main electrodes a and b of the switch S1, thereby closing the switch S1. The third capacitor C81 then discharges by way of the switch S1 and the third resistor R31 when the voltage compensated in the third resistor R31 (specifically, triggering voltage) occurs at the triggering electrode c of the switch S2. The voltage is applied to the triggering electrode c of the switch S2, and a main discharge occurs between the main electrodes a and b of the switch S2, thereby closing the switch S2. The third capacitor C82 then discharges by way of the switch S2 and the third resistor R32 when the voltage compensated in the third resistor R32 (specifically, a triggering voltage) occurs at the triggering electrode c of the switch S3. The voltage is applied to the triggering electrode c of the switch S3, and a main discharge occurs between the main electrodes a and b of the switch S3, thereby closing the switch S3.

Specifically, according to the aforesaid circuit, the triggering power source of each of the switches S1 to S3 is also independent as in the circuit in FIG. 6, and the triggering voltages are voltages appearing between the triggering electrodes c and the second main electrodes b of the switches S1 to S3. Therefore, no matter how the potentials of the second main electrodes b of the switches S1 to S3 may change, the triggering voltages are not affected by the change. Specifically, for the second capacitors C81 and C82 (for example, ceramic capacitors) of 40 kV and 2000 pF, delays in starting the operation of the switches S1 to S3 are respectively 5 to 8 nsec. Specifically, the disadvantage in the aforesaid second solution, that is, "the disadvantage that the application timings of triggering voltage easily differ according to electrical elements" is eliminated. Accordingly, the maximum charging voltage after reversing can be made to be 240 kV.

The configuration is made by only the single triggering voltage source 3, the third capacitors C81 and C82 respectively provided for the switches S1 and S2, the third resistors R31 and R32 respectively provided for the switches S2 and S3, and the connection wires thereof. In addition, the triggering voltage source 3 is also comparable to a so-called CDI unit, which ignites a spark plug of a gasoline engine, and is inexpensive. It should be noted that the third capacitors C81 and C82 also compose a closed circuit by way of the second resistors R21 to R22; therefore, it is preferable to make the resistance of the third resistors R31 and R32 higher than the resistance of the second resistors R21 to R22 in terms of obtaining a higher efficiency.

Figure 9:
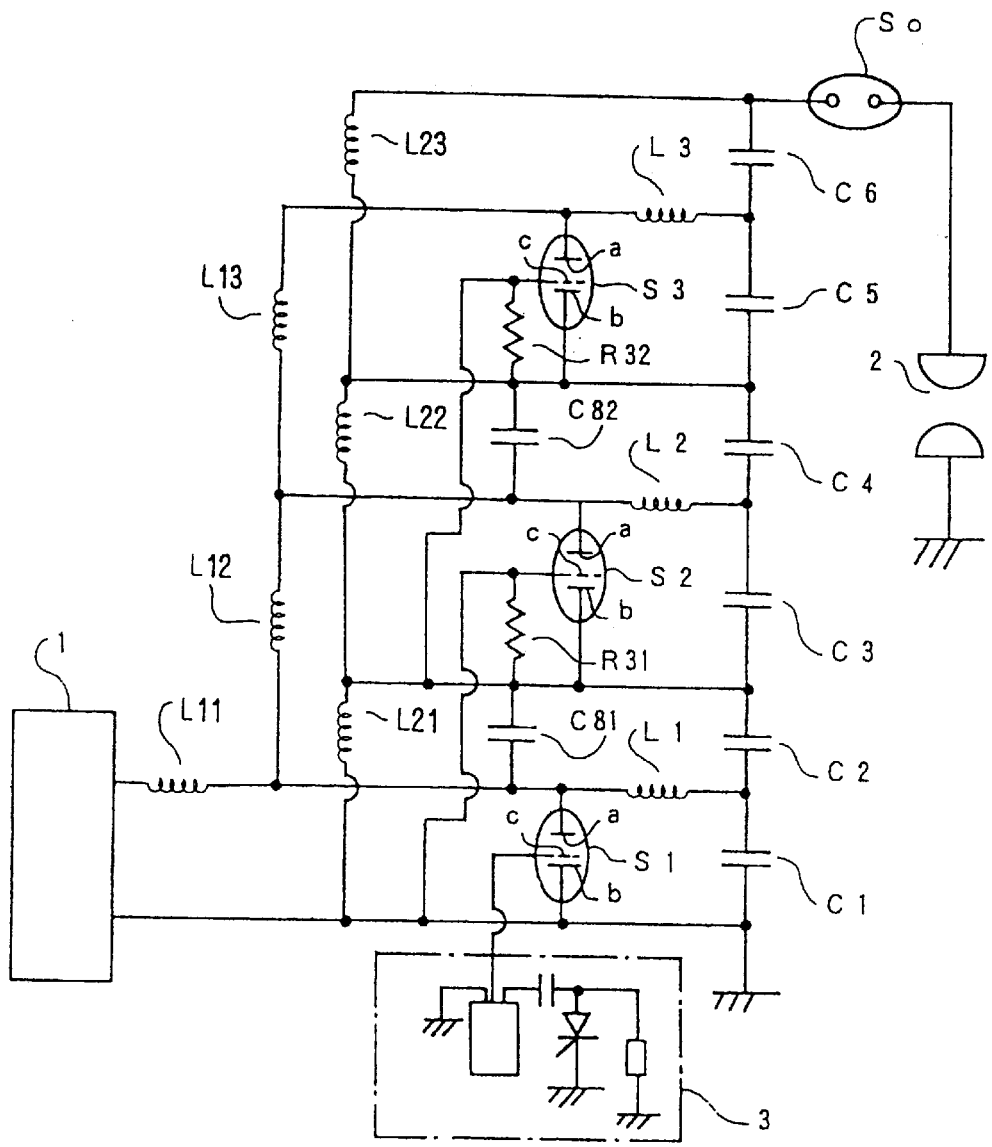
FIG. 9 is a circuit diagram in which first and second resistors in FIG. 8 are replaced by coils.
Figure 10:
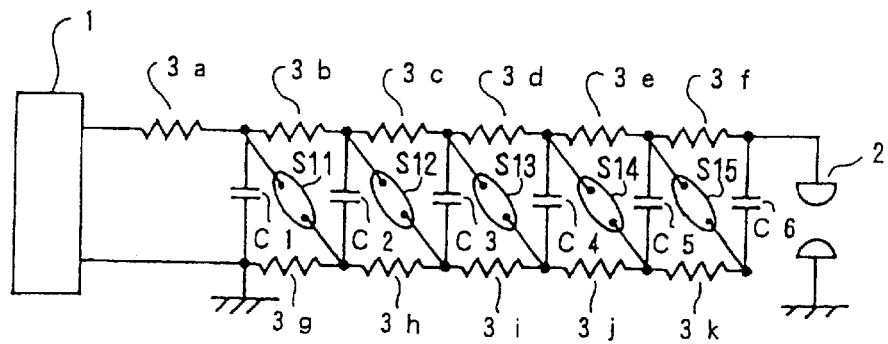
FIG. 10 is a circuit diagram of a power unit for creating discharge shock waves of the prior art.

Incidentally, as shown in FIG. 9, the resistors R11 to R13 and R21 to R23 can be replaced by the second coils L11 to L13 and the third coils L21 to L23. The same operational effects as above are obtained.

Industrial Availability

The present invention is useful as a power unit for creating discharge shock waves and is advantageous in performance, reliability, durability, and cost.

We claim:

1. A power unit for creating discharge shock waves, said power unit comprising:

a discharge electrode;

a plurality of capacitors connected in series with each other and with said discharge electrode to form a plurality of stages including a first stage and a last stage, with every other one of said plurality of capacitors constituting a first group of capacitors and a remainder of said plurality of capacitors constituting a second group of capacitors, each of said plurality of capacitors having a first terminal and a second terminal;

a plurality of first coils, each of said first coils having a first terminal and a second terminal;

a plurality of switches, each of said plurality of switches having a first main electrode, a second main electrode, and a triggering electrode;

a respective one of said first coils being associated with a respective one of said switches and a respective one of the capacitors in said first group of capacitors so that each capacitor in said first group of capacitors can be switched into a LC series circuit;

a power source having a first terminal and a second terminal;

a plurality of first electrical elements, each of said first electrical elements being selected from the group consisting of resistors and coils, said plurality of first electrical elements being connected in series with each other and to said first terminal of said power source, with a connection between adjacent ones of said plurality of first electrical elements being connected to a connection between the first terminal of a respective one of said first coils and the first main electrode of the respective one of said switches which is associated therewith;

a plurality of second electrical elements, each of said second electrical elements being selected from the group consisting of resistors and coils, said plurality of second electrical elements being connected in series with each other between said second terminal of said power source and said discharge electrode, with a connection between adjacent ones of said plurality of second electrical elements being connected to a connection between a respective one of the capacitors in said second group of capacitors and the second main electrode of a respective one of said switches;

a triggering voltage source;

a plurality of second capacitors; and a plurality of insulating pulse transformers, each of said insulating pulse transformers having a primary side and a secondary side, the primary side of each respective one of said insulating pulse transformers and each respective one of said second capacitors being associated with a stage, other than the final stage, represented by a capacitor of said first group of capacitors;

wherein the primary side of a respective insulating pulse transformer and a respective one of said second capacitors are connected in series between the first main electrode and the second main electrode of a respective switch;

wherein the first main electrode of a respective switch is connected to a first terminal of the associated one of said first coils, and the second main electrode of a respective switch is connected to a first terminal of the associated one of said first group of capacitors;

wherein the triggering electrode, of the switch which is associated with said first stage, is connected to said triggering voltage source; and wherein the secondary side of a respective insulating pulse transformer is connected between the triggering electrode and the second main electrode of a respective switch, other than the switch associated with the first stage.

2. A power unit in accordance with claim 1, wherein each of said switches is selected from the group consisting of a triple-pole spark gap, a thyratron, an ignitron, and a thyristor.

3. A power unit in accordance with claim 1, wherein each of said first electrical elements is a resistor.

4. A power unit in accordance with claim 3, wherein each of said second electrical elements is a resistor.

5. A power unit in accordance with claim 1, wherein each of said first electrical elements is a coil.

6. A power unit in accordance with claim 5, wherein each of said second electrical elements is a coil.

7. A power unit in accordance with claim 1, wherein each of said second electrical elements is a resistor.

8. A power unit in accordance with claim 1, wherein each of said second electrical elements is a coil.

9. A power unit in accordance with claim 1, wherein the second terminal of each capacitor, other than the capacitor of the last stage, is connected to the first terminal of the capacitor of a next stage.

10. A power unit in accordance with claim 9, wherein the first terminal of a respective first coil is connected to a first main electrode of the associated switch, the second terminal of the respective first coil is connected to the second terminal of the associated capacitor of said first group of capacitors, and the second main electrode of the respective switch is connected to the first terminal of the associated capacitor of said first group of capacitors.

11. A power unit in accordance with claim 10, wherein the first terminal of the capacitor of the first stage is connected to the second terminal of said power source.

12. A power unit in accordance with claim 11, wherein each of said switches is selected from the group consisting of a triple-pole spark gap, a thyratron, an ignitron, and a thyristor.

13. A power unit in accordance with claim 11, wherein each of said first electrical elements is a resistor.

14. A power unit in accordance with claim 13, wherein each of said second electrical elements is a resistor.

15. A power unit in accordance with claim 11, wherein each of said first electrical elements is a coil.

16. A power unit in accordance with claim 15, wherein each of said second electrical elements is a coil.

17. A power unit in accordance with claim 11, wherein each of said second electrical elements is a resistor.

18. A power unit in accordance with claim 11, wherein each of said second electrical elements is a coil.

19. A power unit in accordance with claim 1, further comprising a main switch connected between the capacitor of the last stage and the discharge electrode.

20. A power unit for creating discharge shock waves, said power unit comprising:

a discharge electrode;

a plurality of capacitors connected in series with each other and with said discharge electrode to form a plurality of stages including a first stage and a last stage, with every other one of said plurality of capacitors constituting a first group of capacitors and a remainder of said plurality of capacitors constituting a second group of capacitors, each of said plurality of capacitors having a first terminal and a second terminal;

a plurality of first coils, each of said first coils having a first terminal and a second terminal;

a plurality of switches, each of said plurality of switches having a first main electrode, a second main electrode, and a triggering electrode;

a respective one of said first coils being associated with a respective one of said switches and a respective one of the capacitors in said first group of capacitors so that each capacitor in said first group of capacitors can be switched into a LC series circuit;

a power source having a first terminal and a second terminal;

a plurality of first electrical elements, each of said first electrical elements being selected from the group consisting of resistors and coils, said plurality of first electrical elements being connected in series with each other and to said first terminal of said power source, with a connection between adjacent ones of said plurality of first electrical elements being connected to a connection between the first terminal of a respective one of said first coils and the first main electrode of the respective one of said switches which is associated therewith;

a plurality of second electrical elements, each of said second electrical elements being selected from the group consisting of resistors and coils, said plurality of second electrical elements being connected in series with each other between said second terminal of said power source and said discharge electrode, with a connection between adjacent ones of said plurality of second electrical elements being connected to a connection between a respective one of the capacitors in said second group of capacitors and the second main electrode of a respective one of said switches;

a triggering voltage source;

a plurality of second capacitors; and a plurality of resistors;

wherein the first main electrode of a respective switch, other than the switch associated with a last one of the capacitors of said first group of capacitors, is connected to the second main electrode of a next one of said switches via a respective one of said second capacitors;

wherein the second main electrode of a respective switch, other than the switch associated with the last one of the capacitors of said first group of capacitors, is connected to the triggering electrode of a next one of said switches;

wherein the first main electrode of a respective switch is connected to a first terminal of the associated one of said first coils, the second main electrode of a respective switch is connected to a first terminal of the associated one of said first group of capacitors;

wherein the triggering electrode, of the switch which is associated with said first stage, is connected to said triggering voltage source; and wherein a respective resistor of said plurality of resistors is connected between the triggering electrode and the second main electrode of a respective switch, other than the switch associated with the first stage.

21. A power unit in accordance with claim 20, wherein each of said switches is selected from the group consisting of a triple-pole spark gap, a thyratron, an ignitron, and a thyristor.

22. A power unit in accordance with claim 20, wherein each of said first electrical elements is a resistor.

23. A power unit in accordance with claim 22, wherein each of said second electrical elements is a resistor.

24. A power unit in accordance with claim 20, wherein each of said first electrical elements is a coil.

25. A power unit in accordance with claim 24, wherein each of said second electrical elements is a coil.

26. A power unit in accordance with claim 20, wherein each of said second electrical elements is a resistor.

27. A power unit in accordance with claim 20, wherein each of said second electrical elements is a coil.

28. A power unit in accordance with claim 20, further comprising a main switch connected between the capacitor of the last stage and the discharge electrode.

* * * * *